United States Patent
Liu et al.

(10) Patent No.: US 8,315,050 B2
(45) Date of Patent: Nov. 20, 2012

(54) ORNAMENT ATTACHMENT MECHANISM AND ELECTRONIC DEVICE USING THE SAME

(75) Inventors: Bao-Shuai Liu, Shenzhen (CN); Wen-Yan Yang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 641 days.

(21) Appl. No.: 12/610,347

(22) Filed: Nov. 2, 2009

(65) Prior Publication Data
US 2010/0269315 A1    Oct. 28, 2010

(30) Foreign Application Priority Data
Apr. 28, 2009    (CN) .......................... 2009 1 0301932

(51) Int. Cl.
*G06F 1/16*    (2006.01)

(52) U.S. Cl. .................. 361/679.56; 312/263; 200/535; 439/582; 604/174

(58) Field of Classification Search ............... 312/140.3, 312/140.1, 244, 330.1, 262, 263, 215, 265.1, 312/317.3, 223.1; 361/736, 740, 747, 679.01, 679.02, 679.09, 679.27, 679.55, 679.56, 679.58, 679.57; 200/293, 339, 5 A, 535, 51.06; 439/522, 489, 60, 567, 469, 131, 582; 604/174, 177, 180; 248/206.5, 156, 158
See application file for complete search history.

(56) References Cited

U.S. PATENT DOCUMENTS

| | | | |
|---|---|---|---|
| 7,061,755 B2 * | 6/2006 | Lin et al. ................... | 361/679.58 |
| 2008/0027391 A1 * | 1/2008 | Bierman ...................... | 604/174 |
| 2010/0124831 A1 * | 5/2010 | Chou et al. .................... | 439/131 |

* cited by examiner

Primary Examiner — Hung Duong
(74) Attorney, Agent, or Firm — Altis Law Group, Inc.

(57) ABSTRACT

An ornament attachment mechanism includes a base, a cover, and a post. The base defines a cavity, a first through hole, and a second through hole. The first through hole is coaxial with the second through hole, and the cavity communicates with the first through hole and the second through hole. The cover defines a recessed portion. The post includes a body and a head. The body passes through the second through hole and the second through hole. The head is received in the recessed portion and is retained by the base and the cover. An electronic device using the ornament attachment mechanism is also provided.

8 Claims, 5 Drawing Sheets

ORNAMENT ATTACHMENT MECHANISM AND ELECTRONIC DEVICE USING THE SAME

BACKGROUND

1. Technical Field

The present disclosure relates to ornament attachment mechanisms and electronic devices and, particularly, to an electronic device using the ornament attachment mechanism.

2. Description of Related Art

Typically, ornament attachment mechanisms of portable electronic devices are formed on the housings of the electronic devices. Once an ornament attachment mechanism of an electronic device is broken, users have to replace the housing of the electronic device with another housing having a new attachment mechanism. It tends to bring trouble and high cost to the users.

BRIEF DESCRIPTION OF THE DRAWINGS

The components of the drawings are not necessarily drawn to scale, the emphasis instead being placed upon clearly illustrating the principles of an ornament attachment mechanism and an electronic device using the same. Moreover, in the drawings, like reference numerals designate corresponding parts throughout several views.

DETAILED DESCRIPTION

Figure 1:
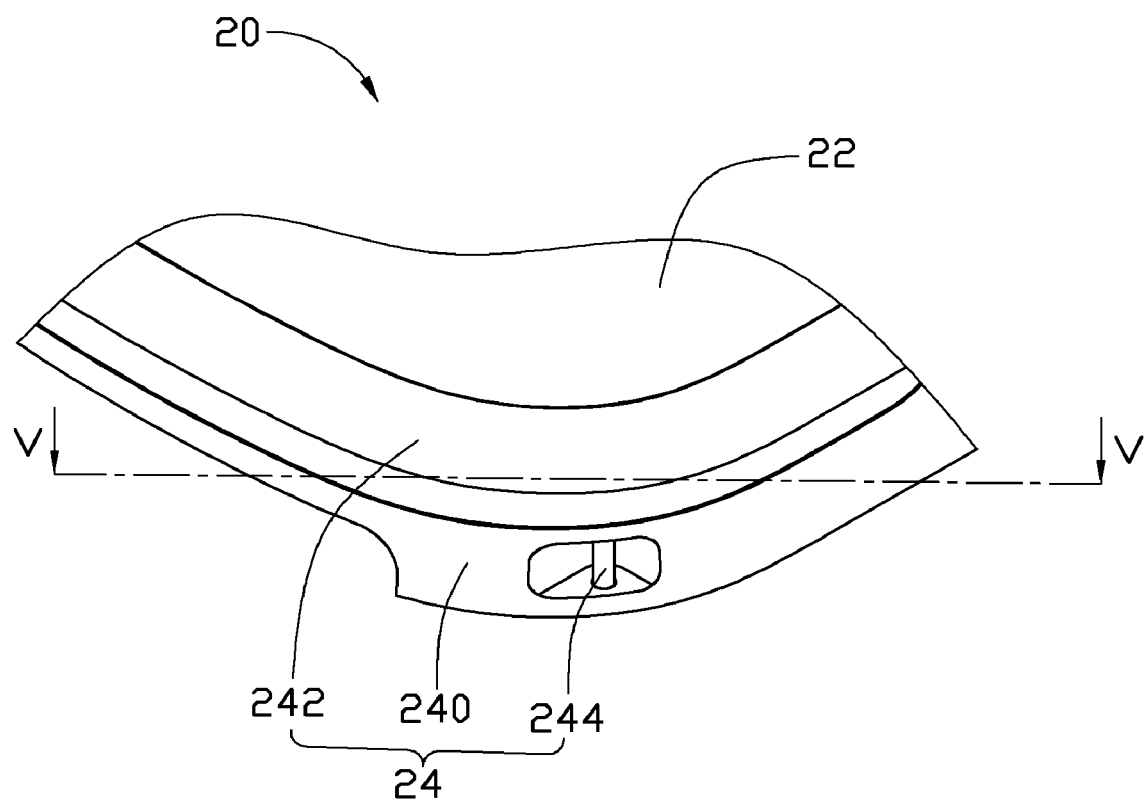
FIG. 1 is a partial, perspective view of an electronic device in accordance with an exemplary embodiment, showing an ornament attachment mechanism secured to a housing of the electronic device.

Referring to FIG. 1, an electronic device 20 includes a housing 22 and an ornament attachment mechanism 24. The mechanism 24 includes a base 240, a cover 242 attached to the base 240, and a post 244 secured to the base 240 and the cover 242. The post 244 can be used to hang/attach ornaments (not shown) such as a hand strap or dangling charm. In the exemplary embodiment, the base 240 and the cover 242 are a part of the housing 22. In an alternative embodiment, the base 240 and the cover 242 may be independent devices connected to the housing 22.

Figure 2:
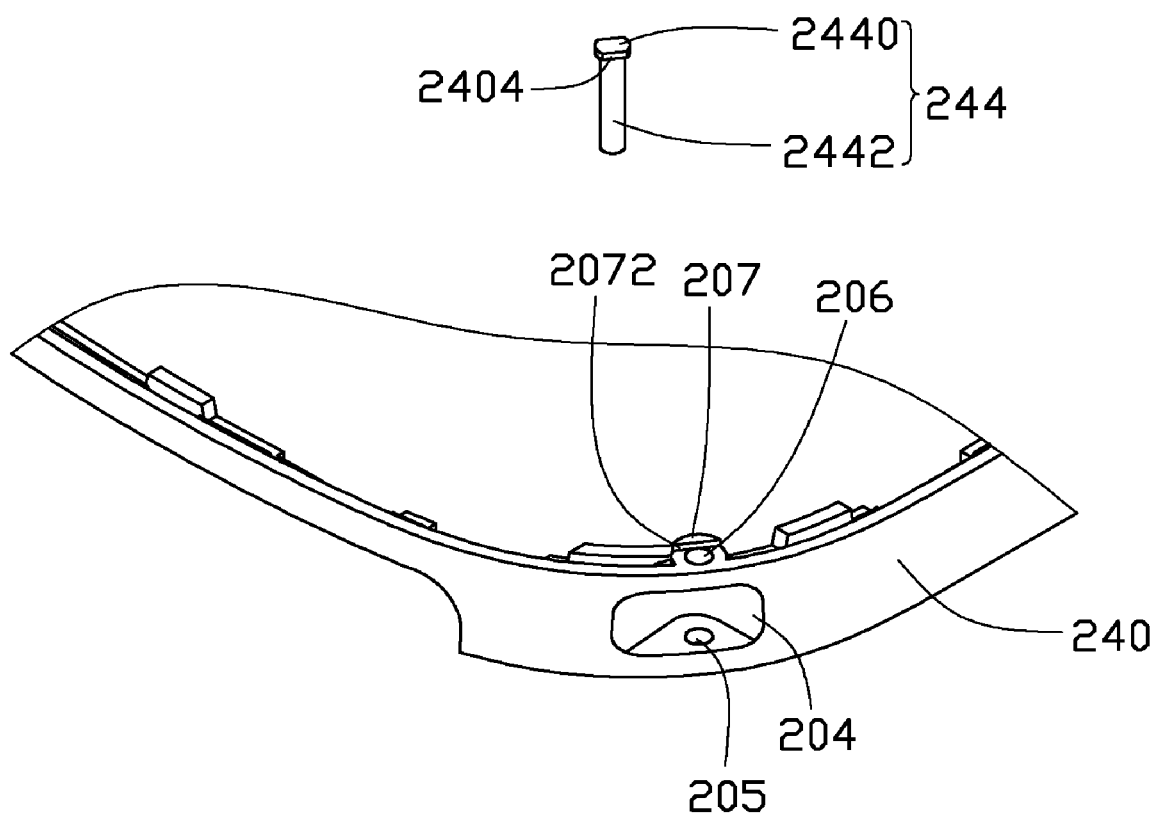
FIG. 2 is a partial, exploded perspective view of the electronic device of FIG. 1, showing a base and a post of the ornament attachment mechanism.
Figure 3:
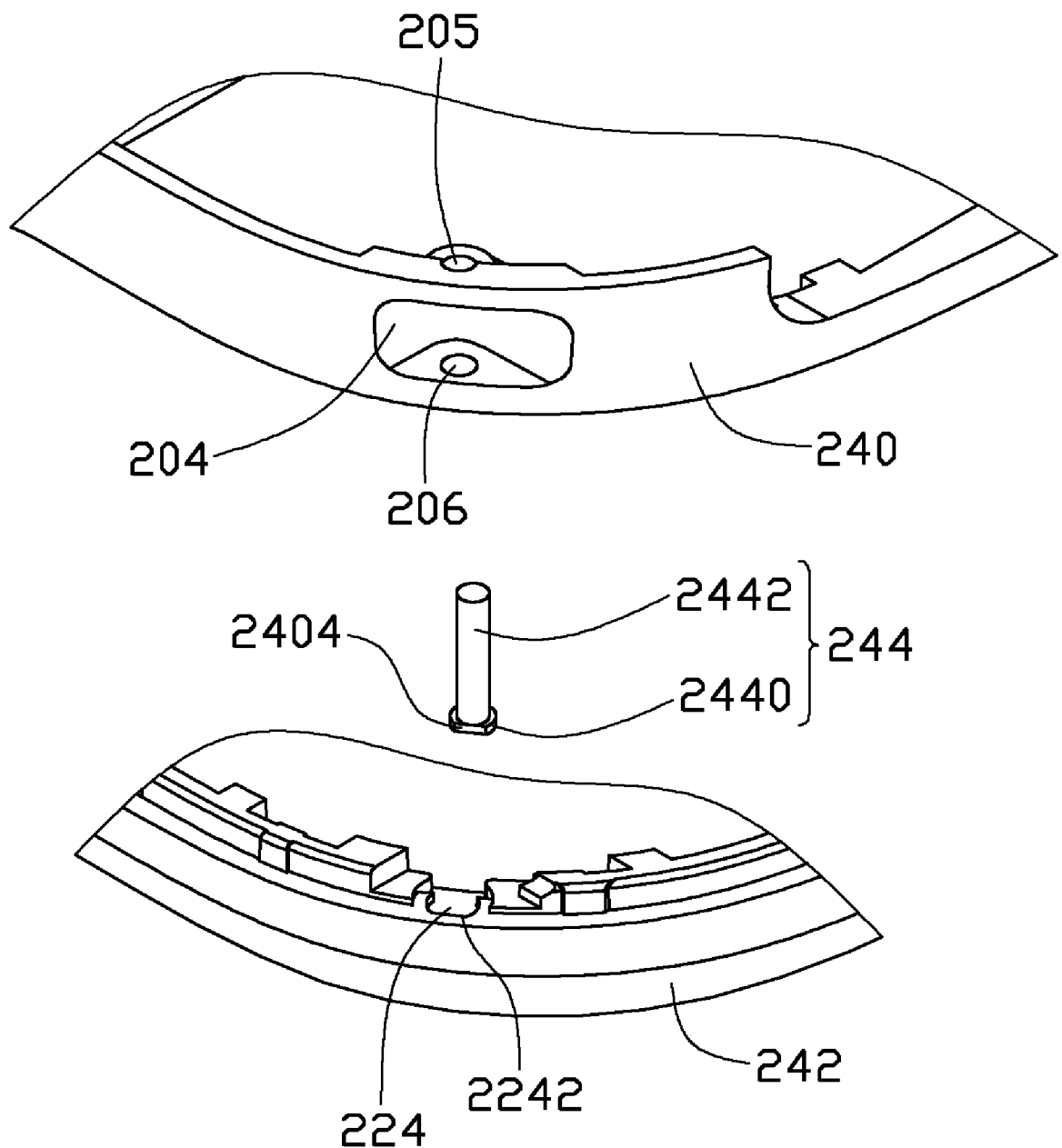
FIG. 3 is a partial, exploded perspective view of the electronic device of FIG. 1, showing a base, a post, and a cover of the ornament attachment mechanism.
Figure 4:
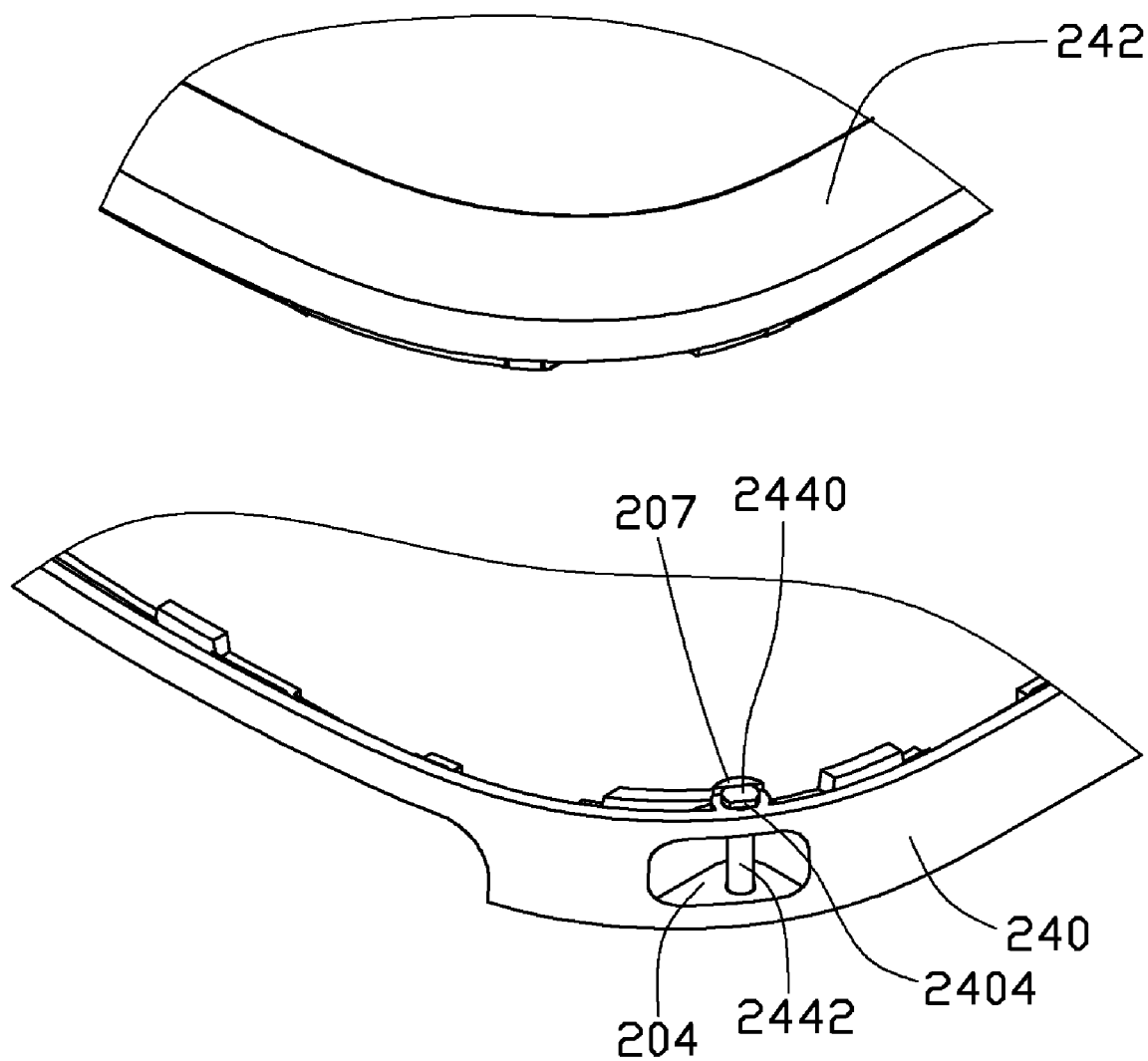
FIG. 4 is a partial, exploded perspective view of the electronic device of FIG. 1, showing a post secured to a base of the ornament attachment mechanism.

Referring also to FIGS. 2-4, a side surface of the base 240 defines a cavity 204. The bottom and the top of the base 240 define a first through hole 205 and a second through hole 206 correspondingly. The first through hole 205 and the second through hole 206 communicate with the cavity 204. The first through hole 205 is coaxial with the second through hole 206. A first stopper projection 207 protrudes out from the top of the base 240. The first stopper projection 207 includes a side surface 2072. The side surface 2072 of the first stopper projection 207 is adjacent to the second through hole 206 and is opposite to the cavity 204.

The post 244 includes a head 2440 and a cylindrical body 2442. The diameter of the body 2442 is substantially equal to that of the second through hole 206 and the first through hole 205, thus the body 2442 can pass through the second through hole 206 and the first through hole 205 in sequence. The size of the bottom of the head 2440 is greater than that of the second through hole 206, thus the head 2440 cannot pass through the second through hole 206. The head 2440 includes two opposite side surfaces 2404. The height of each of the side surfaces 2404 is substantially equal to that of the side surface 2072 of the projection 207. The side surface 2404 opposite to the cavity 204 engages with the side surface 2072 of the projection 207. In the exemplary embodiment, at least a portion of the post 244 is made of stiff material such as steel or iron.

The cover 242 defines a recessed portion 224 for receiving the head 2440 of the post 244. The recessed portion 224 includes a side surface 2242, and the depth of the recessed portion 224 substantially equals to the height of the projection 207. The side surface 2404 of the post 244 opposite to the side surface 2072 of the projection 207 engages with the side surface 2242 of the recessed portion 224.

Figure 5:
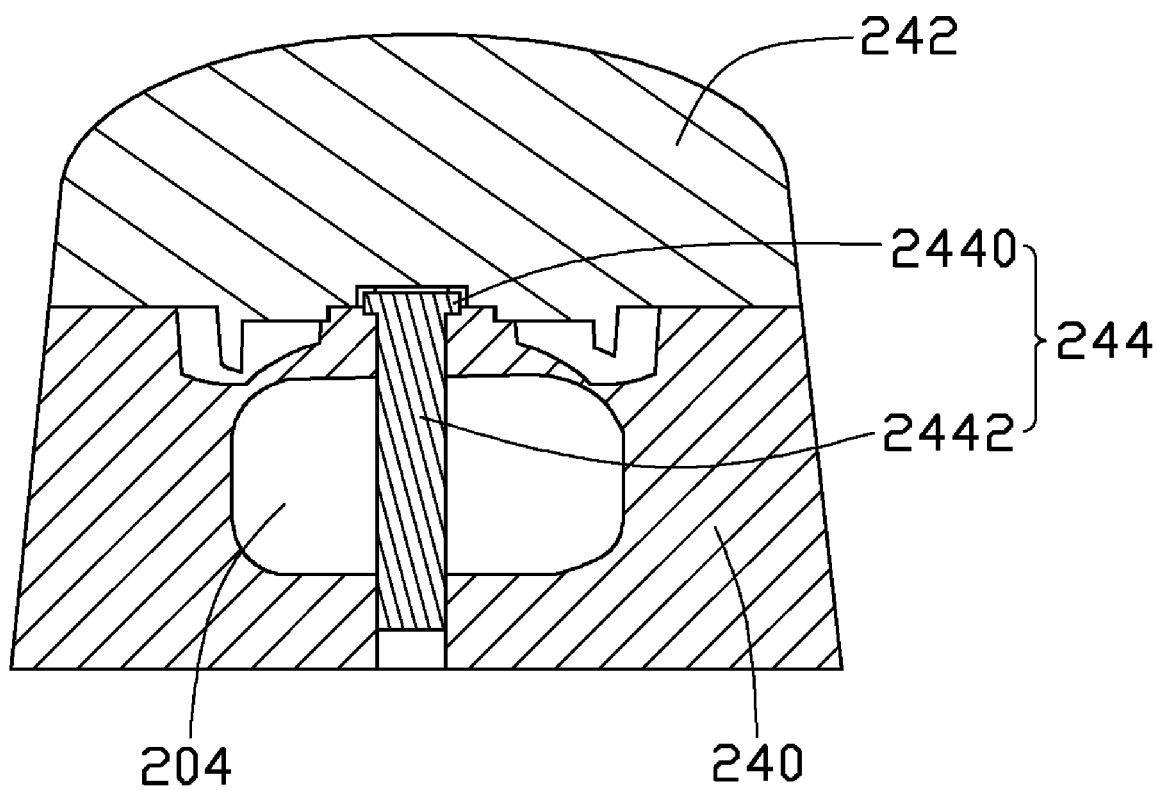
FIG. 5 is a partial, cross-sectional perspective view of the electronic device of FIG. 1.

Referring also to FIG. 5, the head 2440 of the post 244 is received in the recessed portion 224 of the cover 242 and is retained by the base 240, thus the axial movement of the post 244 is limited. Furthermore, the side surface 2072 of the projection 207 and the side surface 2242 of the recessed portion 224 engage the two opposite side surfaces 2404 of the head 2440, thus the rotation of the post 244 about its axis is limited.

With such configuration, if the post 244 is broken, the post 244 can be easily replaced by another post by separating the base 240 and the cover 242.

Although the present disclosure has been specifically described on the basis of the exemplary embodiment thereof, the disclosure is not to be construed as being limited thereto. Various changes or modifications may be made to the embodiment without departing from the scope and spirit of the disclosure.

What is claimed is:

1. An ornament attachment mechanism, comprising:
a base defining a cavity, a first through hole, and a second through hole, wherein the first through hole is coaxial with the second through hole, and the cavity communicates with the first through hole and the second through hole;
a cover defining a recessed portion; and
a post comprising a body and a head, wherein the body passes through the first through hole and the second through hole; and the head is received in the recessed portion and is retained by the base and the cover.

2. The mechanism as described in claim 1, wherein a projection protrudes out from the top of the base, and the projection comprises a first side surface adjacent to the second through hole; the head of the post comprises two opposite side surfaces, and one of the side surfaces of the head engages with the side surface of the projection.

3. The mechanism as described in claim 2, wherein the recessed portion comprises a side surface; and the other of the side surfaces of the head of the post engages with the side surface of the recessed portion.

4. The mechanism as described in claim 1, wherein at least a portion of the post is made of stiff material.

5. An electronic device, comprising:
a base defining a cavity, a first through hole, and a second through hole, wherein the first through hole is coaxial with the second post hole, and the cavity communicates with the first through hole and the second through hole;

a cover defining a recessed portion; and an ornament attachment mechanism comprising a post, wherein the post comprises a body and a head, wherein the body passes through the second through hole and the first through hole; and the head is received in the recessed portion and is retained by the base and the cover.

6. The electronic device as described in claim 5, wherein a projection protrudes out from the top of the base, and the projection comprises a side surface adjacent to the second through hole; the head of the post comprises two opposite side surfaces, and one of the side surfaces engages with the side surface of the projection.

7. The electronic device as described in claim 6, wherein the recessed portion comprises a side surface; and the other of the side surfaces of the head of the post engages with the side surface of the recessed portion.

8. The electronic device as described in claim 5, wherein at least a portion of the post is made of stiff material.

* * * * *